(12) United States Patent
Okada (10) Patent No.: US 10,666,221 B2
(45) Date of Patent: May 26, 2020

(54) ELASTIC WAVE DEVICE

(71) Applicant: Murata Manufacturing Co., Ltd., Nagaokakyo-shi, Kyoto-fu (JP)

(72) Inventor: Shinichi Okada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 39 days.

(21) Appl. No.: 16/234,660

(22) Filed: Dec. 28, 2018

(65) Prior Publication Data

US 2019/0140614 A1    May 9, 2019

Related U.S. Application Data

(63) Continuation of application No. PCT/JP2018/024180, filed on Jun. 26, 2018.

(30) Foreign Application Priority Data

Jun. 30, 2017  (JP) .................................. 2017-128726

(51) Int. Cl.
 *H03H 9/02* (2006.01)
 *H03H 9/64* (2006.01)
 (Continued)

(52) U.S. Cl.
 CPC .... *H03H 9/02921* (2013.01); *H03H 9/02559* (2013.01); *H03H 9/02574* (2013.01);
 (Continued)

(58) Field of Classification Search
 CPC .. H03H 9/02; H03H 9/02535; H03H 9/02818; H03H 9/25; H03H 9/64
 See application file for complete search history.

(56) References Cited

U.S. PATENT DOCUMENTS 7,583,161 B2 * 9/2009 Tanaka ................. H03H 9/0576
                                                    333/133
9,021,669 B2 * 5/2015 Fukano ................. H03H 9/059
                                                    29/25.35
(Continued)

FOREIGN PATENT DOCUMENTS

JP    2016-066989 A    4/2016
WO    2013/128823 A1   9/2013
(Continued)

OTHER PUBLICATIONS

English translation of Official Communication issued in International Patent Application No. PCT/JP2018/024180, dated Sep. 11, 2018.
(Continued)

*Primary Examiner* — Dean O Takaoka
*Assistant Examiner* — Alan Wong
(74) *Attorney, Agent, or Firm* — Keating & Bennett, LLP (57) ABSTRACT

An elastic wave device includes a multilayer body, an antenna terminal, a ground terminal, a signal terminal, an IDT electrode, and an insulating film. The multilayer body includes a support substrate and a piezoelectric film disposed on the support substrate. The antenna terminal is disposed on or above the support substrate. The ground terminal is directly disposed on the support substrate. The signal terminal is disposed above the support substrate. The IDT electrode is disposed on the piezoelectric film. The insulating film is disposed between the support substrate and the signal terminal. The multilayer body includes one of a layer made of a high acoustic-velocity material and an acoustic reflection layer.

18 Claims, 5 Drawing Sheets

(51) Int. Cl.
  *H03H 9/25* (2006.01)
  *H03H 9/10* (2006.01)
  *H03H 9/145* (2006.01)
  *H03H 9/05* (2006.01)

(52) U.S. Cl.
  CPC .... *H03H 9/02866* (2013.01); *H03H 9/02992* (2013.01); *H03H 9/059* (2013.01); *H03H 9/1092* (2013.01); *H03H 9/145* (2013.01); *H03H 9/25* (2013.01); *H03H 9/6483* (2013.01); *H03H 9/6489* (2013.01)

(56) References Cited

U.S. PATENT DOCUMENTS

| | | | |
|---|---|---|---|
| 9,124,239 B2 * | 9/2015 | Nakayama | H03H 9/0057 |
| 9,385,686 B2 * | 7/2016 | Nishizawa | H03H 9/725 |
| 9,484,883 B2 * | 11/2016 | Nishizawa | H03H 9/54 |
| 10,340,888 B2 * | 7/2019 | Muranaka | H03H 9/059 |
| 2014/0125197 A1 | 5/2014 | Fujita et al. | |
| 2016/0277003 A1 | 9/2016 | Kikuchi et al. | |
| 2016/0294354 A1 | 10/2016 | Saijo et al. | |
| 2017/0099044 A1 | 4/2017 | Takamine | |
| 2017/0288123 A1 | 10/2017 | Hatano et al. | |
| 2018/0091116 A1 | 3/2018 | Kai | |
| 2018/0109243 A1 | 4/2018 | Takamine | |

FOREIGN PATENT DOCUMENTS

| | | |
|---|---|---|
| WO | 2015/098678 A1 | 7/2015 |
| WO | 2015/098679 A1 | 7/2015 |
| WO | 2016/013330 A1 | 1/2016 |
| WO | 2016/208427 A1 | 12/2016 |
| WO | 2016/208670 A1 | 12/2016 |

OTHER PUBLICATIONS

Official Communication issued in International Patent Application No. PCT/JP2018/024180, dated Sep. 11, 2018.

* cited by examiner

ELASTIC WAVE DEVICE

CROSS REFERENCE TO RELATED APPLICATIONS

This application claims the benefit of priority to Japanese Patent Application No. 2017-128726 filed on Jun. 30, 2017 and is a Continuation Application of PCT Application No. PCT/JP2018/024180 filed on Jun. 26, 2018. The entire contents of each application are hereby incorporated herein by reference.

BACKGROUND OF THE INVENTION

1. Field of the Invention

The present invention relates to an elastic wave device.

2. Description of the Related Art

Elastic wave devices are widely used in filters of cellular phones. International Publication No. 2015/098678 discloses an elastic wave device including a multilayer body constituted by a high acoustic-velocity film, a low acoustic-velocity film, and a piezoelectric film stacked on a support substrate. In this elastic wave device, an insulating layer is provided on the support substrate so as to surround the multilayer body as viewed from above, and under bump metal layers to be electrically connected to an external source are all provided on the insulating layer.

International Publication No. 2015/098679 discloses an elastic wave device including a multilayer body constituted by a high acoustic-velocity film, a low acoustic-velocity film, and a piezoelectric film stacked on a support substrate. In this elastic wave device, under bump metal layers are connected to wiring which is directly provided on the support substrate.

When mounting or using an elastic wave device, a piezoelectric film is heated or cooled. At this time, electric charge is generated by the pyroelectric effect. In the elastic wave device disclosed in International Publication No. 2015/098678, the under bump metal layers are disposed on the insulating layer. Accordingly, the electric charge generated from the piezoelectric film may be transferred to a ground electrode. However, it is not possible to remove electric charge transferred to the support substrate which is not connected to the ground electrode. As a result, the support substrate is charged. A potential difference is thus generated between the support substrate and the piezoelectric film so as to produce electrostatic capacitance therebetween. Due to the influence of this electrostatic capacitance, the characteristics of the elastic wave device, such as the fractional bandwidth and the Q factor, may be degraded.

In the elastic wave device disclosed in International Publication No. 2015/098679, the under bump metal layers are connected to the wiring directly provided on the support substrate. With this configuration, however, the electrical resistance between the support substrate and the under bump metal layers is low. When the elastic wave device is connected to an electronic component via the under bump metal layers and bumps, the electrical resistance between this electronic component and the support substrate also becomes low. A leakage current from the elastic wave device is thus likely to leak into the electronic component, which may cause operation faults in the electronic component.

SUMMARY OF THE INVENTION

Preferred embodiments of the present invention provide elastic wave devices each of which is able to reduce or minimize degradation of characteristics by reducing electrostatic capacitance between a support substrate and a piezoelectric film and which are also less likely to cause operation faults in an electronic component connected to the elastic wave device.

An elastic wave device according to a preferred embodiment of the present invention includes a multilayer body, an antenna terminal, a ground terminal, a signal terminal, an IDT electrode, and a first insulating film. The multilayer body includes a support substrate and a piezoelectric film disposed on the support substrate. The antenna terminal is disposed on or above the support substrate and is connected to an antenna. The ground terminal is disposed directly on, or above via a conductive layer, the support substrate and is connected to a ground potential. The signal terminal is disposed above the support substrate and is connected to a signal potential. The IDT electrode is disposed on the piezoelectric film. The first insulating film is disposed between the support substrate and the signal terminal. The multilayer body includes one of a layer made of a high acoustic-velocity material and an acoustic reflection layer. The high acoustic-velocity material is a material through which bulk waves propagate at a higher acoustic velocity than elastic waves propagating through the piezoelectric film. The acoustic reflection layer includes a low acoustic-impedance layer having relatively low acoustic impedance and a high acoustic-impedance layer having relatively high acoustic impedance.

In an elastic wave device according to a preferred embodiment of the present invention, the elastic wave device may further include a second insulating film disposed between the support substrate and the antenna terminal. With this configuration, it is possible to make the electrical resistance between the antenna terminal and the support substrate high. A leakage current which leaks from the antenna terminal to the signal terminal via the support substrate is thus less likely to occur.

In an elastic wave device according to a preferred embodiment of the present invention, the antenna terminal may be directly disposed on the support substrate.

In an elastic wave device according to a preferred embodiment of the present invention, the multilayer body may include the layer made of the high acoustic-velocity material and a low acoustic-velocity film disposed between the support substrate and the piezoelectric film. The low acoustic-velocity film is made of a low acoustic-velocity material through which bulk waves propagate at a lower acoustic velocity than elastic waves propagating through the piezoelectric film. With this configuration, it is possible to effectively confine elastic wave energy.

In an elastic wave device according to a preferred embodiment of the present invention, the layer made of the high acoustic-velocity material may be the support substrate.

In an elastic wave device according to a preferred embodiment of the present invention, the layer made of the high acoustic-velocity material may be directly disposed on the support substrate.

In an elastic wave device according to a preferred embodiment of the present invention, the support substrate may be made of Si.

In an elastic wave device according to a preferred embodiment of the present invention, the elastic wave device may further include a support member, a cover member, a plurality of under bump metal layers, and a plurality of bumps. The support member includes a cavity and is disposed on or above the support substrate so as to surround the IDT electrode by the cavity. The cover member is disposed on the support member so as to cover the cavity. The plurality of under bump metal layers pass through the cover member and the support member and are each connected to a corresponding one of the antenna terminal, the signal terminal, and the ground terminal. The plurality of bumps are each bonded to a corresponding one of the plurality of under bump metal layers.

In an elastic wave device according to a preferred embodiment of the present invention, the elastic wave device may further include a support member, a cover member, and a plurality of wiring electrodes. The support member includes a cavity and is disposed on or above the support substrate so as to surround the IDT electrode by the cavity. The cover member is disposed on the support member so as to cover the cavity. The plurality of wiring electrodes are each connected to a corresponding one of the antenna terminal, the signal terminal, and the ground terminal and each extend to the cover member via a side surface of the support member.

According to preferred embodiments of the present invention, it is possible to provide elastic wave devices each of which is able to reduce or minimize degradation of characteristics by reducing electrostatic capacitance between a support substrate and a piezoelectric film and which are also less likely to cause operation faults in electronic components connected to the elastic wave devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

The preferred embodiments disclosed in the specification are only examples. The configurations described in different preferred embodiments may partially be replaced by or combined with each other.

Figure 1:
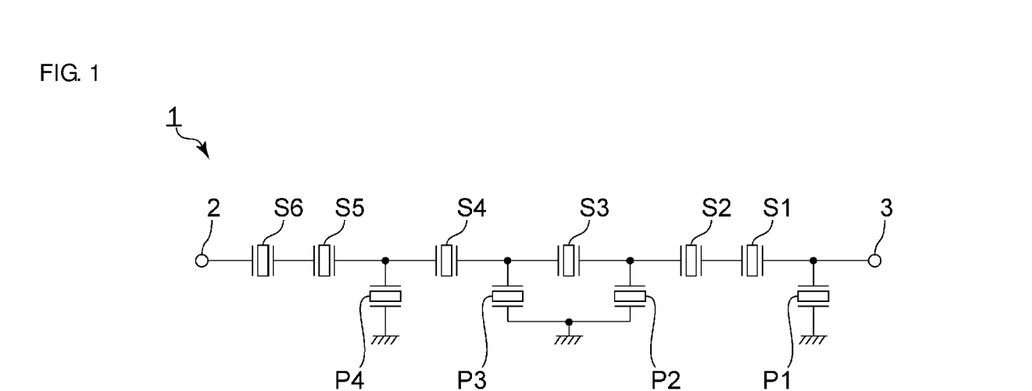
FIG. 1 is a circuit diagram of an elastic wave device according to a first preferred embodiment of the present invention.

FIG. 1 is a circuit diagram of an elastic wave device according to a first preferred embodiment of the present invention.

An elastic wave device 1 of the present preferred embodiment is a ladder filter including series arm resonators S1 through S6 and parallel arm resonators P1 through P4. The elastic wave device 1 includes an antenna terminal 2 connected to an antenna and a signal terminal 3 connected to a signal potential.

Figure 2:
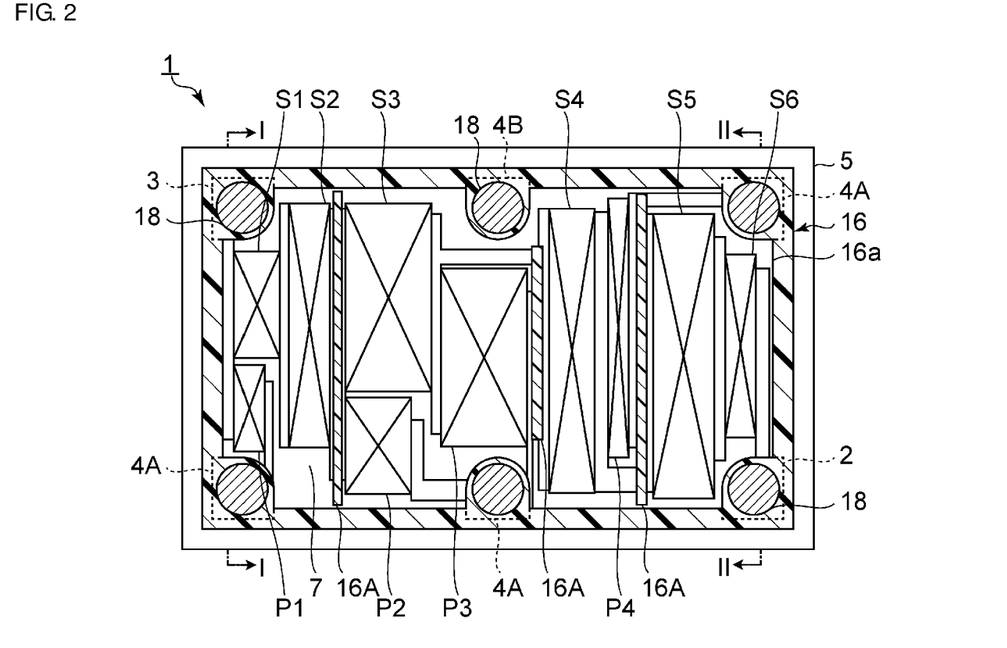
FIG. 2 is a schematic sectional plan view for explaining the electrode configuration of the elastic wave device according to the first preferred embodiment of the present invention.
Figure 3:
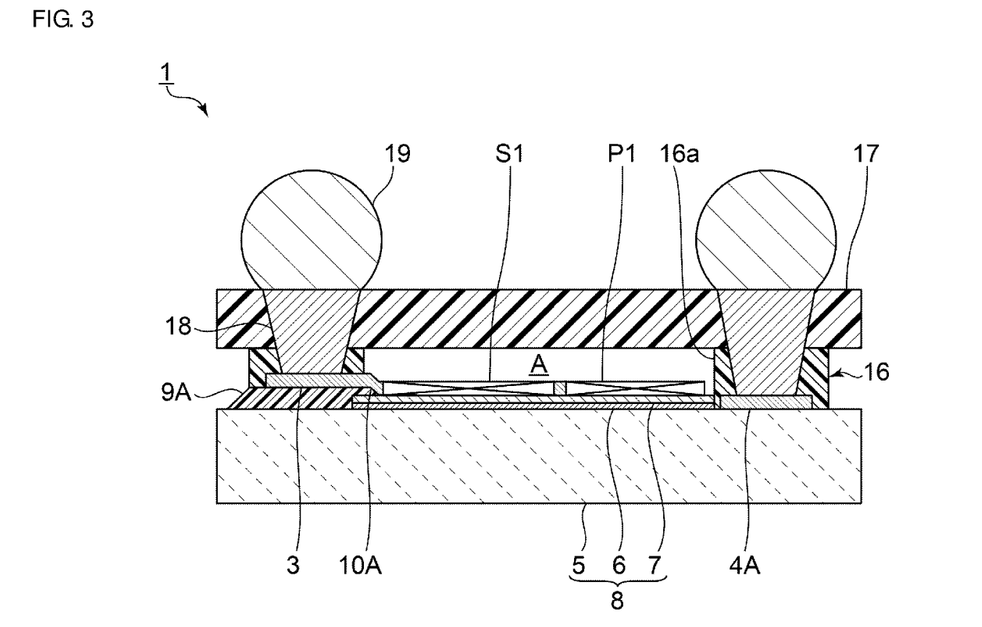
FIG. 3 is a schematic sectional view taken along line I-I in FIG. 2.
Figure 4:
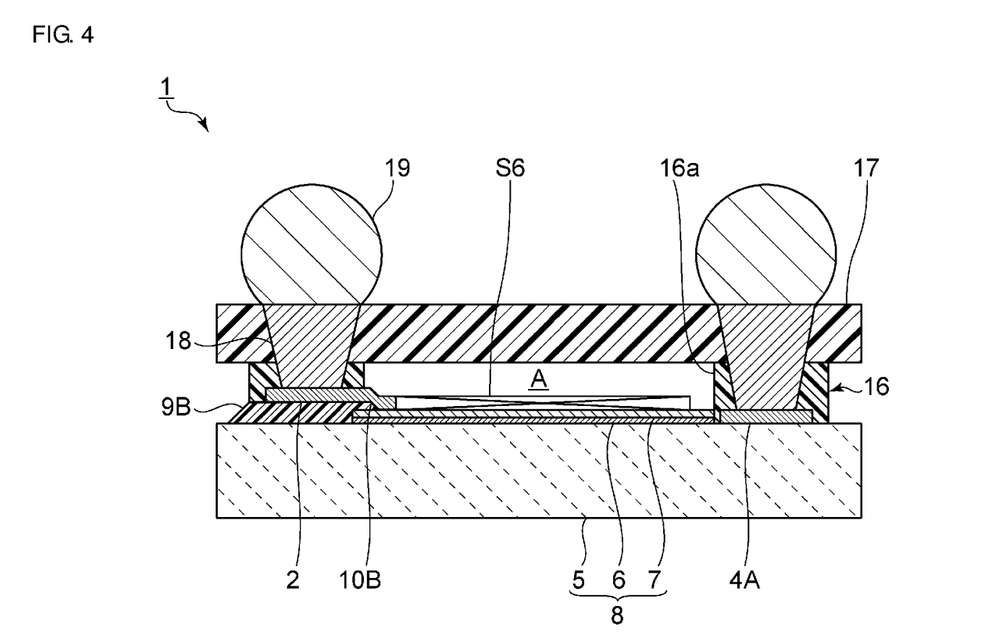
FIG. 4 is a schematic sectional view taken along line II-II in FIG. 2.

FIG. 2 is a schematic sectional plan view for explaining the electrode configuration of the elastic wave device according to the first preferred embodiment. FIG. 3 is a schematic sectional view taken along line I-I in FIG. 2. In FIGS. 2 and 3, each of the series arm resonators and the parallel arm resonators is schematically indicated by a rectangle with two diagonal lines therein. In FIG. 3, the series arm resonator and the parallel arm resonator are schematically shown by including wiring patterns connected to the busbars of the series arm resonator and the parallel arm resonator. In FIG. 4, which will be discussed later, the series arm resonator is also similarly shown.

As shown in FIG. 2, the elastic wave device 1 includes a plurality of ground terminals 4A each connected to a ground potential. The parallel arm resonators P1 through P4 are connected to the corresponding ground terminals 4A. The elastic wave device 1 includes a floating electrode 4B which is connected to none of the series arm resonators S1 through S6 and the parallel arm resonators P1 through P4, but is connected to a ground potential. The elastic wave device 1 may not necessarily include the floating electrode 4B.

As shown in FIG. 3, the elastic wave device 1 includes a multilayer body 8 including a support substrate 5, a low acoustic-velocity film 6, and a piezoelectric film 7 stacked on each other. In the present preferred embodiment, the support substrate 5 is a layer made of a high acoustic-velocity material. The high acoustic-velocity material is a material through which bulk waves propagate at a higher acoustic velocity than elastic waves propagating through the piezoelectric film 7. The high acoustic-velocity material of the support substrate 5 is preferably Si, for example. However, the material of the support material 5 is not restricted to the above-described material.

The low acoustic-velocity film 6 is a film made of a low acoustic-velocity material through which bulk waves propagate at a lower acoustic velocity than elastic waves propagating through the piezoelectric film 7. In the present preferred embodiment, the low acoustic-velocity material of the low acoustic-velocity film 6 is preferably $SiO_2$, for example. The low acoustic-velocity material of the low acoustic-velocity film 6 may be a material mainly including a compound of glass, silicon oxynitride, tantalum oxide, or silicon oxide having added fluorine, carbon, or boron, for example.

The piezoelectric film 7 is preferably made of, for example, a piezoelectric single crystal, such as LiNbO$_3$ or LiTaO$_3$, or suitable piezoelectric ceramics. On the piezoelectric film 7, the plurality of series arm resonators including the series arm resonator S1 and the plural parallel arm resonators including the parallel arm resonator P1 are provided.

The support substrate 5 includes portions extending from the low acoustic-velocity film 6 and the piezoelectric film 7 to the outer peripheral sides, as viewed from above. The above-described ground terminals 4A are disposed at these portions on the support substrate 5. The plurality of ground terminals other than the ground terminal 4A shown in FIG. 3 and the floating electrode are also disposed directly on the support substrate 5.

A first insulating film 9A is directly provided on the support substrate 5 at a position at which it overlaps the signal terminal 3 as viewed from above. The first insulating film 9A extends from the top surface of the support substrate 5 to the top surface of the piezoelectric film 7. In the present preferred embodiment, the first insulating film 9A is preferably made of, for example, polyimide. The first insulating film 9A may be an organic insulating film made of a material other than polyimide, or may be an inorganic insulating film. The first insulating film 9A may not necessarily extend to the top surface of the piezoelectric film 7.

FIG. 4 is a schematic sectional view taken along line II-II in FIG. 2.

A second insulating film 9B is provided between the support substrate 5 and the antenna terminal 2. The second insulating film 9B is preferably made of a material similar to that of the first insulating film. In this manner, the antenna terminal 2 is indirectly disposed on the support substrate 5 with the second insulating film 9B interposed therebetween, while the signal terminal is indirectly disposed on the support substrate 5 with the first insulating film interposed therebetween. The plurality of ground terminals 4A are directly disposed on the support substrate 5. The antenna terminal 2 may alternatively be directly disposed on the support substrate 5.

As shown in FIG. 2, a support member 16 including a cavity 16a is disposed on the support substrate 5. The cavity 16a surrounds the series arm resonators S1 through S6 and the parallel arm resonators P1 through P4. The support member 16 covers the antenna terminal 2, the signal terminal 3, the floating electrode 4B, and the plurality of ground terminals 4A. The support member 16 is preferably made of a suitable resin, for example.

As shown in FIG. 3, a cover member 17 is provided on the support member 16 so as to cover the cavity 16a. The plurality of series arm resonators including the series arm resonator S1 and the plurality of parallel arm resonators including the parallel arm resonator P1 are disposed within a hollow space A surrounded by the support substrate 5, the support member 16, and the cover member 17.

A plurality of under bump metal layers 18 pass through the cover member 17 and the support member 16. Each of the under bump metal layers 18 is connected to a corresponding one of the antenna terminal, the signal terminal 3, the plurality of ground terminals 4A, and the floating electrode. A plurality of bumps 19 are bonded to the exposed portions of the respective under bump metal layers 18 on the surface of the cover member 17. Each of the plurality of series arm resonators including the series arm resonator S1 and the plurality of parallel arm resonators including the parallel arm resonator P1 is electrically connected to an external source via the antenna terminal, the signal terminal 3, or one of the ground terminals 4A and via one of the under bump metal layers 18 and one of the bumps 19. The elastic wave device 1 of the present preferred embodiment preferably has a WLP (Wafer Level Package) structure, for example.

The plurality of series arm resonators including the series arm resonator S1 and the plurality of parallel arm resonators including the parallel arm resonator P1 are preferably elastic wave resonators, for example. The configuration of the elastic wave resonators will be discussed below.

Figure 5:
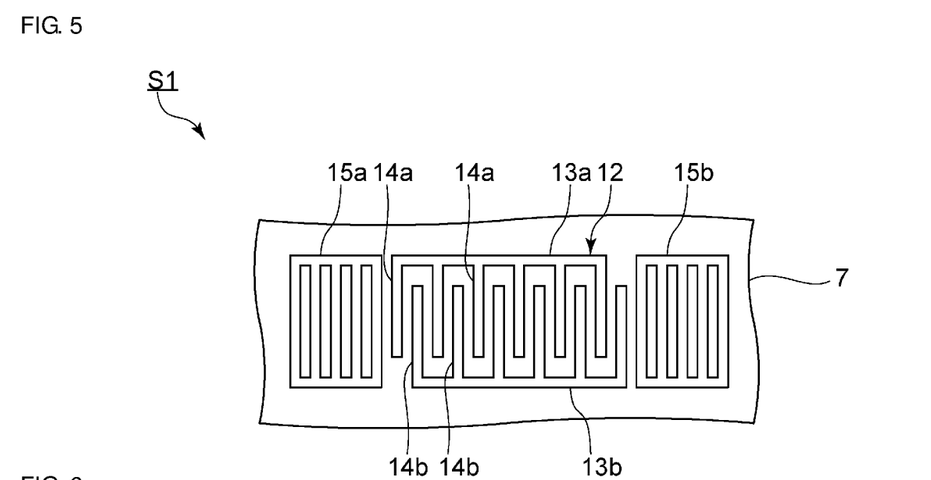
FIG. 5 is a schematic plan view of a series arm resonator and the vicinity thereof positioned closest to a signal terminal in the first preferred embodiment of the present invention.

FIG. 5 is a schematic plan view of the series arm resonator and the vicinity thereof positioned closest to the signal terminal in the first preferred embodiment. In FIG. 5, wiring connected to the series arm resonator is not shown.

The series arm resonator S1 includes an IDT electrode 12 disposed on the piezoelectric film 7. The IDT electrode 12 includes first and second busbars 13a and 13b which oppose each other. The IDT electrode 12 includes a plurality of first electrode fingers 14a and a plurality of second electrode fingers 14b. One end of each of the first electrode fingers 14a is connected to the first busbar 13a. One end of each of the second electrode fingers 14b is connected to the second busbar 13b. The plurality of first electrode fingers 14a and the plurality of second electrode fingers 14b are interdigitated with one another.

An alternating current is applied to the IDT electrode 12 so as to excite elastic waves. In the propagating direction of elastic waves, a reflector 15a is disposed at one side of the IDT electrode 12, and a reflector 15b is disposed at the other side of the IDT electrode 12. The IDT electrode 12 and the reflectors 15a and 15b may defined by a multilayer metal film including a plurality of stacked metal layers or by a single-layer metal film.

The series arm resonator S1 is an elastic wave resonator including the IDT electrode 12 and the reflectors 15a and 15b. Similarly, the other series arm resonators and the plurality of parallel arm resonators are also elastic wave resonators each including an IDT electrode and reflectors.

As shown in FIG. 3, the elastic wave device 1 includes the multilayer body 8 including the support substrate 5 made of a high acoustic-velocity material, the low acoustic-velocity film 6, and the piezoelectric film 7 stacked on each other, thus effectively confining elastic wave energy. The multilayer body 8 may not necessarily include the low acoustic-velocity film 6. Even without the low acoustic-velocity film 6, the elastic wave device 1 is able to confine elastic wave energy.

The circuit configuration of the elastic wave device 1 will be discussed below. As shown in FIG. 1, the series arm resonators S1 through S6 are connected in series with each other between the signal terminal 3 and the antenna terminal 2. The parallel arm resonator P1 is connected between a ground potential and a node between the signal terminal 3 and the series arm resonator S1. The parallel arm resonator P2 is connected between a ground potential and a node between the series arm resonators S2 and S3. The parallel arm resonator P3 is connected between a ground potential and a node between the series arm resonators S3 and S4. The parallel arm resonator P4 is connected between a ground potential and a node between the series arm resonators S4 and S5. The parallel arm resonators P2 and P3 are connected to the same ground potential.

The circuit configuration of the elastic wave device 1 is not restricted to the above-described configuration. The elastic wave device 1 is not limited to a ladder filter, and may be a filter device including a longitudinally-coupled-resonator elastic wave filter, for example.

A feature of the present preferred embodiment is as follows. As shown in FIG. 3, the signal terminal 3 is indirectly disposed on the support substrate 5 with the first insulating film 9A interposed therebetween, while the plurality of ground terminals 4A and the floating electrode are directly disposed on the support substrate 5. This reduces electrostatic capacitance between the support substrate 5 and the piezoelectric film 7, thus making it possible to reduce or minimize the degradation of the characteristics of the elastic wave device 1. Operation faults are less likely to occur in an electronic component connected to the elastic wave device 1. This will be explained below.

Due to a temperature change in the piezoelectric film 7 which is heated when using the elastic wave device 1, electric charge is generated in the piezoelectric film 7 by the pyroelectric effect. In this case, if electric charge is transferred to the support substrate 5 and charges it, the electrostatic capacitance is produced between the support substrate 5 and the piezoelectric film 7 as described above. The characteristics of the elastic wave device 1 may thus be degraded.

In contrast, in the present preferred embodiment, the plurality of ground terminals 4A are directly disposed on the support substrate 5. Because of the ground terminals 4A, electric charge transferred to the support substrate 5 is immediately transferred to the outside. This reduces electrostatic capacitance between the support substrate 5 and the piezoelectric film 7, and the degradation of the characteristics, such as insertion loss, is less likely to occur.

The floating electrode, which is not connected to the plurality of parallel arm resonators including the parallel arm resonator P1, is directly disposed on the support substrate 5. The floating electrode is connected to a ground potential. This facilitates the transferring of electric charge produced by the pyroelectric effect to the outside via the floating electrode.

Additionally, in the present preferred embodiment, the signal terminal 3 is indirectly disposed on the support substrate with the first insulating film 9A interposed therebetween. Accordingly, the electrical resistance between the support substrate 5 and the signal terminal 3 to be connected to an external source is high. When the elastic wave device 1 is connected to an electronic component via the signal terminal 3, the under bump metal layer 18, and the bump 19, the electrical resistance between this electronic component and the support substrate 5 is high because of the first insulating film 9A. A leakage current from the elastic wave device 1 connected to an electronic component is thus less likely to leak into the electronic component. As a result, the occurrence of operation faults of the electronic component is reduced.

When the support substrate 5 is made of a semiconductor, such as Si, as in the present preferred embodiment, a leakage current is likely to occur because the electrical resistance of the support substrate 5 is low. A leakage current from the elastic wave device 1 thus tends to leak into the electronic component. Therefore, preferred embodiments of the present invention are able to be suitably used particularly when the support substrate 5 is made of a semiconductor, such as Si.

As shown in FIG. 3, in the present preferred embodiment, the signal terminal 3 is directly disposed on the first insulating film 9A, and connection wiring 10A is provided continuously from the signal terminal 3. The connection wiring 10A is connected to the series arm resonator S1 and extends from the top surface of the first insulating film 9A to the top surface of the piezoelectric film 7. The first insulating film 9A also extends to the top surface of the piezoelectric film 7. This configuration is able to reduce the size of a step portion of the connection wiring 10A, and the connection wiring 10A is thus less likely to break. Additionally, the surface of the first insulating film 9A that opposes the connection wiring 10A extends and tilts from the support member 16 toward the piezoelectric film 7 in the thickness direction of the piezoelectric film 7. This configuration reduces the sharpness of the bending of the connection wiring 10A, and the connection wiring 10A is thus even less likely to break. The relationship between the second insulating film 9B and connection wiring 10B connected to the antenna terminal 2 shown in FIG. 4 is the same as or similar to that between the first insulating film 9A and the connection wiring 10A.

As shown in FIG. 2, a plurality of wall members 16A are provided on the support substrate 5 within the cavity 16a of the support member 16. This will be explained more specifically below. One of the plurality of wall members 16A divides the series arm resonator S2 and a set of the series arm resonator S3 and the parallel arm resonator P2. Another one of the plurality of wall members 16A divides the series arm resonator S4 and the parallel arm resonator P3. Another one of the plurality of wall members 16A divides the series arm resonator S5 and the parallel arm resonator P4. The plurality of wall members 16A are preferably made of a material similar to that of the support member 16.

The plurality of wall members 16A are bonded to the cover member to support it. This configuration reduces the likelihood that the hollow space will collapse when external force is applied to the cover member, thus improving the strength of the elastic wave device 1.

Figure 6:
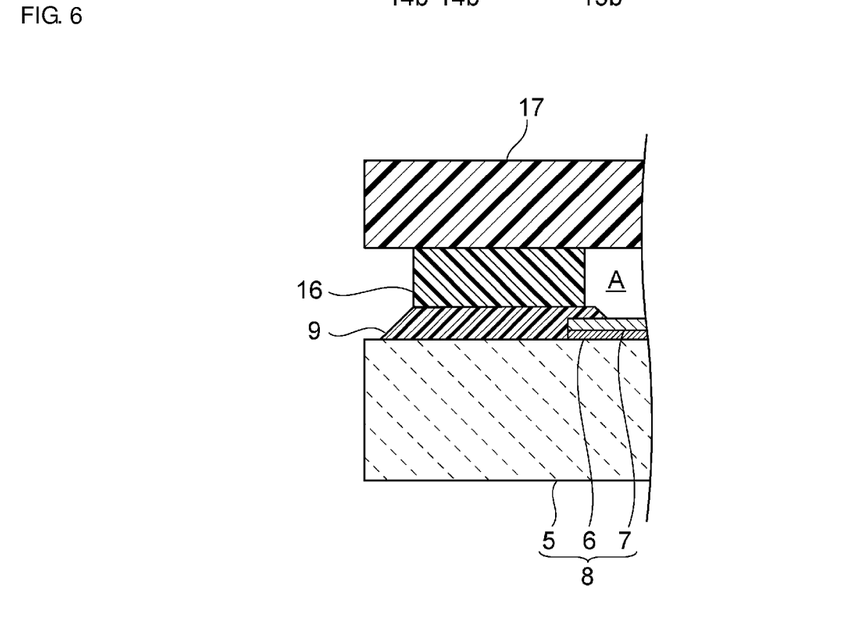
FIG. 6 is an enlarged front sectional view schematically illustrating a portion of a support member and the vicinity thereof in the area in which none of an antenna terminal, a signal terminal, ground terminals, and a floating electrode are provided in the elastic wave device of the first preferred embodiment of the present invention.

FIG. 6 is an enlarged front sectional view schematically illustrating a portion of the support member and the vicinity thereof in the area in which none of the antenna terminal, the signal terminal, the ground terminals, and the floating electrode are provided in the elastic wave device of the first preferred embodiment.

In the present preferred embodiment, the support member is indirectly disposed on the support substrate 5 with an insulating film 9 interposed therebetween, except for a portion in which a ground terminal or the floating electrode is provided. The insulating film 9 is provided in the area other than a portion in which the antenna terminal or the signal terminal is disposed. The insulating film 9 is preferably made of a material similar to that of the first and second insulating films. The insulating film 9 is provided continuously from the first and second insulating films. This improves the uniformity of the distance between the support substrate 5 and the cover member 17 and accordingly improves the adhesion and bonding strength between the support member 16 and the cover member 17. As a result, the sealability and tightness of the hollow space A are able to be further improved. However, the insulating film 9 may not necessarily be provided.

Figure 7:
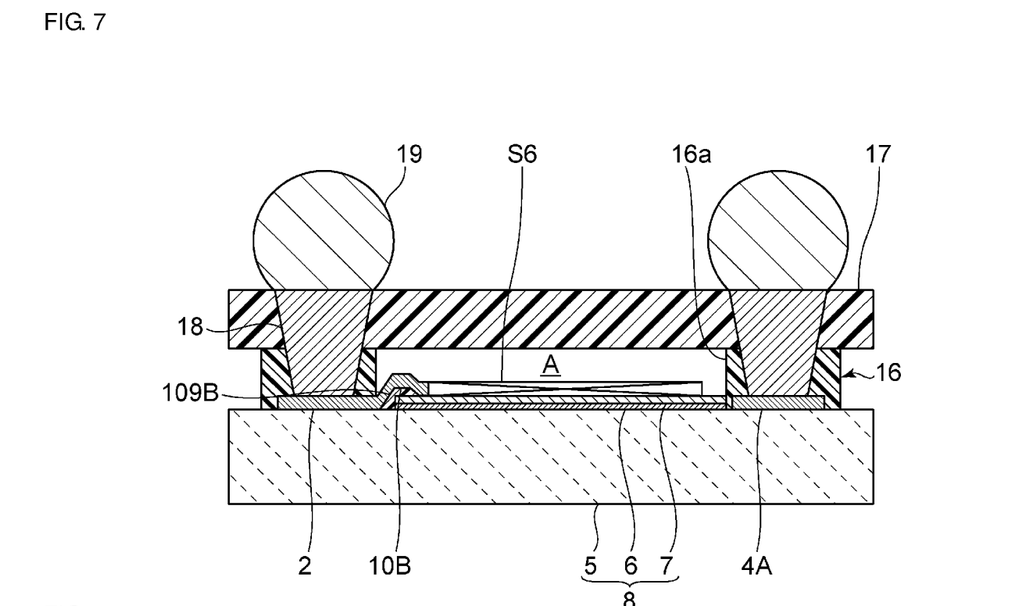
FIG. 7 is a schematic front sectional view of an elastic wave device according to a modified example of the first preferred embodiment of the present invention.

FIG. 7 is a schematic front sectional view of an elastic wave device according to a modified example of the first preferred embodiment.

In the present modified example, the antenna terminal 2 is directly disposed on the support substrate 5. In the present modified example, as well as in the first preferred embodiment, the signal terminal is indirectly disposed on the support substrate 5 with the first insulating film interposed therebetween, and the plurality of ground terminals 4A are directly disposed on the support substrate 5. This reduces electrostatic capacitance between the support substrate 5 and the piezoelectric film 7, thus making it possible to reduce or minimize the degradation of the characteristics of the elastic wave device. Operation faults are also less likely to occur in an electronic component connected to the elastic wave device.

In the present modified example, a third insulating film 109B is provided to overlap a portion of the connection wiring 10B, as viewed from above. The third insulating film 109B extends from the top surface of the support substrate 5 to the top surface of the piezoelectric film 7. The third insulating film 109B is positioned between a portion of the connection wiring 10B and a set of the support substrate 5 and the piezoelectric film 7. The surface of the third insulating film 109B that opposes the connection wiring 10B extends and tilts from the support substrate 5 toward the piezoelectric film 7 in the thickness direction of the piezoelectric film 7. This configuration reduces the sharpness of the bending of the connection wiring 10B at the portion from the top surface of the support substrate 5 to the top surface of the piezoelectric film 7, and the connection wiring 10B is thus less likely to break. The third insulating film 109B may be provided between connection wiring connected to a ground terminal and a set of the support substrate 5 and the piezoelectric film 7.

Figure 8:
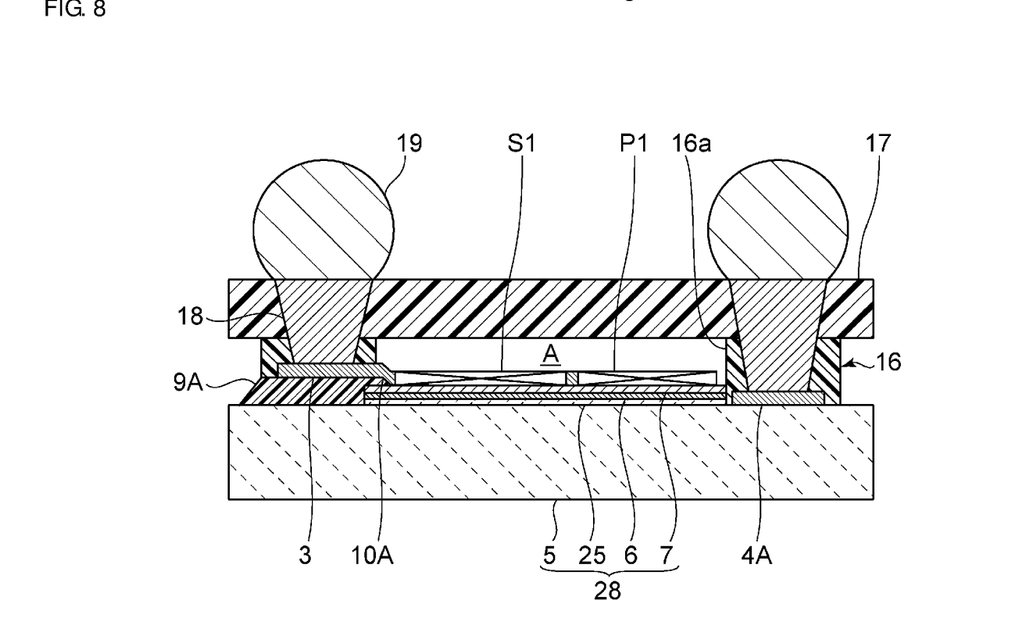
FIG. 8 is a schematic front sectional view of an elastic wave device according to a second preferred embodiment of the present invention.

FIG. 8 is a schematic front sectional view of an elastic wave device according to a second preferred embodiment of the present invention.

The present preferred embodiment is different from the first preferred embodiment in that a layer made of a high acoustic-velocity material in a multilayer body 28 is a high acoustic-velocity film 25 disposed between the support substrate 5 and the low acoustic-velocity film 6. Apart from this point, the configuration of the elastic wave device of the second preferred embodiment is the same as or similar to that of the elastic wave device 1 of the first preferred embodiment. In the present preferred embodiment, the support substrate 5 may be made of a material other than a high acoustic-velocity material.

In the present preferred embodiment, the signal terminal 3 is indirectly disposed on the support substrate 5 with the first insulating film 9A interposed therebetween, and the plurality of ground terminals 4A and the floating electrode are directly disposed on the support substrate 5. This reduces electrostatic capacitance between the support substrate 5 and the piezoelectric film 7, thus making it possible to reduce or minimize the degradation of the characteristics of the elastic wave device. Operation faults are also less likely to occur in an electronic component connected to the elastic wave device.

Figure 9:
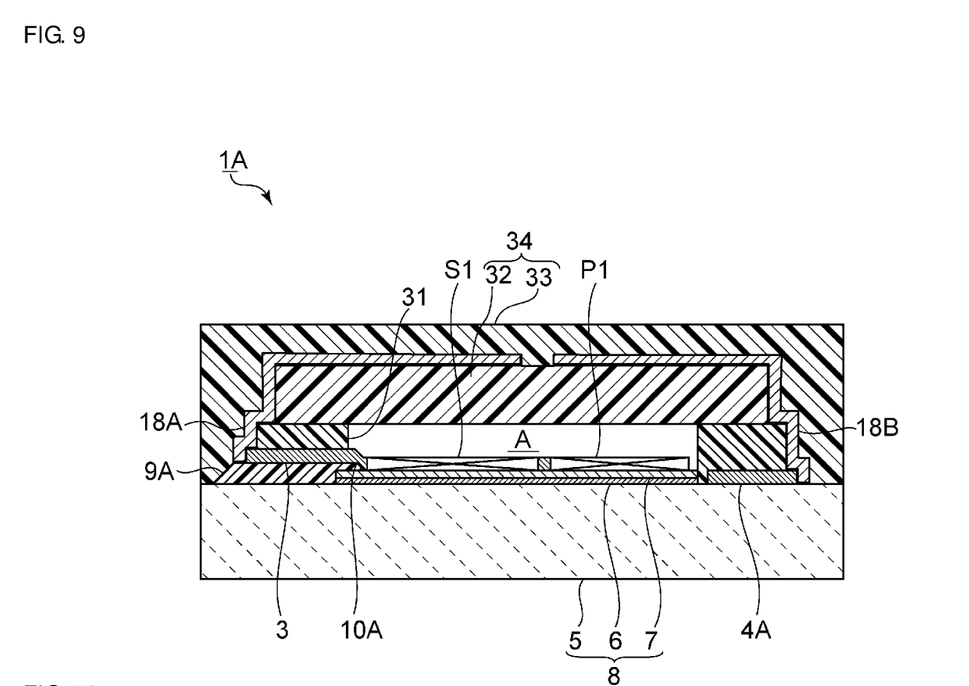
FIG. 9 is a schematic front sectional view of an elastic wave device according to a third preferred embodiment of the present invention.

FIG. 9 is a schematic front sectional view of an elastic wave device according to a third preferred embodiment of the present invention.

In an elastic wave device 1A of the third preferred embodiment, a multilayer body 8 including a low acoustic-velocity film 6 and a piezoelectric film 7 disposed on a support substrate is provided. As in the elastic wave device 1 of the first preferred embodiment, a first insulating film 9A is disposed on the support substrate 5, and connection wiring 10A extends to the top surface of the first insulating film 9A. In the sectional view shown in FIG. 9, as well as that in FIG. 3, the portion in which the series arm resonator S1 and the parallel arm resonator P1 are disposed is shown.

The elastic wave device 1A is different from the elastic wave device 1 in that a wiring electrode 18A is provided instead of the under bump metal layer 18 and the bump 19. The wiring electrode 18A is electrically connected to the signal terminal 3. A support layer 31 is provided above the support substrate 5. The support layer 31 surrounds the portion in which the IDT electrodes are disposed. Thus, in the present preferred embodiment, the hollow space A is provided.

The wiring electrode 18A extends to the outer side surface of the support layer 31. In the elastic wave device 1A, a cover member 34 including first and second cover layers 32 and 33 is provided. The first cover layer 32 is stacked on the support layer 31. The outer side surfaces of the first cover layer 32 are located farther inwards than those of the support layer 31.

The wiring electrode 18A extends to the cover member 34. That is, the wiring electrode 18A extends to the top surface of the first cover layer 32 via the side surface thereof. The second cover layer 33 is stacked on the support substrate 5 so as to cover the first cover layer 32 and also to cover the outer side of the wiring electrode 18A.

In FIG. 9, a wiring electrode 18B is also provided at the side of the ground terminal 4A. The wiring electrode 18B extends from the outer side surface of the support layer 31 to the top surface of the first cover layer 32 via the side surface of the first cover layer 32. A plurality of wiring electrodes including the wiring electrodes 18A and 18B are disposed on the top surface of the first cover layer 32.

In FIG. 9, the sectional view of the portion in which the series arm resonator S1 and the parallel arm resonator P1 are provided is shown. In the other cross sections of the elastic wave device 1A, wiring electrodes extending to the top surface of the first cover layer 32 via the outer side surfaces of the support layer 31 are also provided. In this manner, preferred embodiments of the present invention are applicable, not only to an elastic wave device including bumps and under bump metal layers passing through a support member, but also to elastic wave devices having various other package structures.

Figure 10:
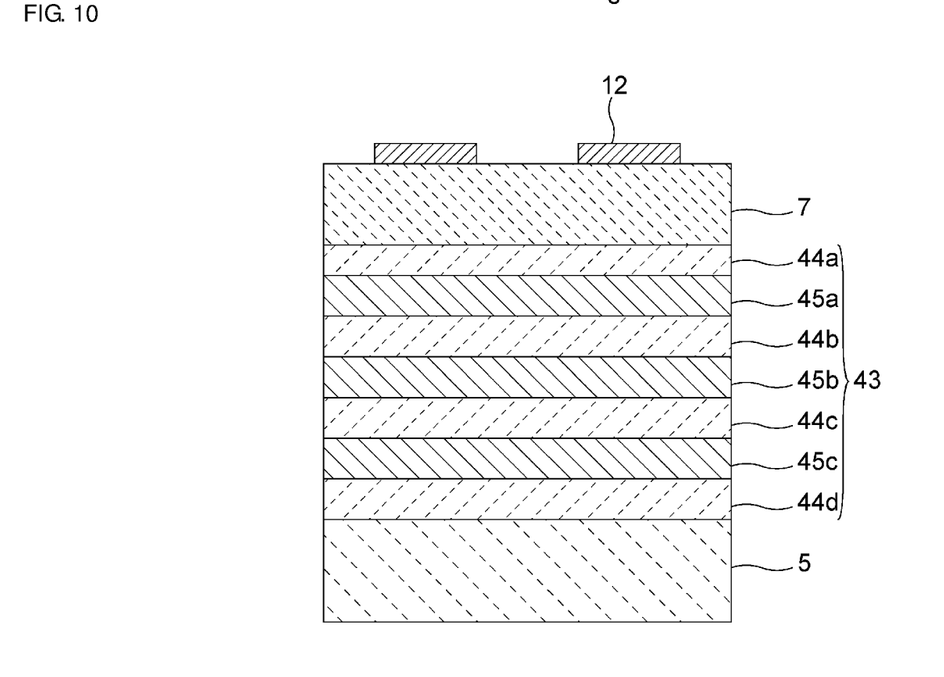
FIG. 10 is a sectional view for explaining a modified example of a multilayer body included in an elastic wave device according to the present invention.

FIG. 10 is a sectional view for explaining a modified example of a multilayer body used in an elastic wave device according to a preferred embodiment of the present invention. As shown in FIG. 10, a multilayer body including an acoustic reflection layer 43 stacked between the support substrate 5 and the piezoelectric film 7 may be used. The acoustic reflection layer 43 includes low acoustic-impedance layers 44a through 44d having relatively low acoustic impedance and high acoustic-impedance layers 45a through 45c having relatively high acoustic impedance. The low acoustic-impedance layers 44a through 44d and the high acoustic-impedance layers 45a through 45c are alternately disposed in the stacking direction. The multilayer body of the elastic wave device of the present modified example may include a structure including such an acoustic reflection layer 43. This also effectively confines elastic wave energy.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a multilayer body including a support substrate and a piezoelectric film disposed on the support substrate;
an antenna terminal disposed on or above the support substrate and connected to an antenna;
a ground terminal disposed directly on or above the support substrate via a conductive layer and connected to a ground potential;
a signal terminal disposed above the support substrate and connected to a signal potential;

an IDT electrode disposed on the piezoelectric film; and a first insulating film disposed between the support substrate and the signal terminal; wherein the multilayer body includes one of a layer made of a high acoustic-velocity material or an acoustic reflection layer, the high acoustic-velocity material being a material through which bulk waves propagate at a higher acoustic velocity than elastic waves propagating through the piezoelectric film, the acoustic reflection layer having a low acoustic-impedance layer having relatively low acoustic impedance and a high acoustic-impedance layer having relatively high acoustic impedance.

2. The elastic wave device according to claim 1, further comprising a second insulating film disposed between the support substrate and the antenna terminal.

3. The elastic wave device according to claim 1, wherein the antenna terminal is directly disposed on the support substrate.

4. The elastic wave device according to claim 1, wherein the multilayer body includes the layer made of the high acoustic-velocity material and a low acoustic-velocity film disposed between the support substrate and the piezoelectric film, the low acoustic-velocity film being made of a low acoustic-velocity material through which bulk waves propagate at a lower acoustic velocity than elastic waves propagating through the piezoelectric film.

5. The elastic wave device according to claim 1, wherein the layer made of the high acoustic-velocity material is the support substrate.

6. The elastic wave device according to claim 1, wherein the layer made of the high acoustic-velocity material is directly disposed on the support substrate.

7. The elastic wave device according to claim 1, wherein the support substrate is made of Si.

8. The elastic wave device according to claim 1, further comprising:
   a support including a cavity and disposed on or above the support substrate so as to surround the IDT electrode by the cavity;
   a cover disposed on the support so as to cover the cavity;
   a plurality of under bump metal layers passing through the cover and the support and each connected to a corresponding one of the antenna terminal, the signal terminal, and the ground terminal; and
   a plurality of bumps that are each bonded to a corresponding one of the plurality of under bump metal layers.

9. The elastic wave device according to claim 1, further comprising:
   a support including a cavity and disposed on or above the support substrate so as to surround the IDT electrode by the cavity;
   a cover disposed on the support so as to cover the cavity; and
   a plurality of wiring electrodes each connected to a corresponding one of the antenna terminal, the signal terminal, and the ground terminal and each extending to the cover via a side surface of the support.

10. The elastic wave device according to claim 1, wherein the low acoustic-impedance layer is made of $SiO_2$.

11. The elastic wave device according to claim 1, wherein the piezoelectric film is made of $LiNbO_3$ or $LiTaO_3$.

12. The elastic wave device according to claim 1, further comprising a floating electrode that is disposed on the support.

13. The elastic wave device according to claim 1, further comprising:
   a connection wiring that is provided continuously from the signal terminal; wherein
   the connection wiring extends from a top surface of the first insulating film to a top surface of the piezoelectric film.

14. The elastic wave device according to claim 13, wherein a surface of the first insulating film that opposes the connection wiring extends and tilts from the support toward the piezoelectric film.

15. The elastic wave device according to claim 8, further comprising a plurality of walls provided on the support substrate within the cavity.

16. The elastic wave device according to claim 15, wherein the plurality of walls are bonded to and support the cover.

17. The elastic wave device according to claim 9, further comprising a plurality of walls provided on the support substrate within the cavity.

18. The elastic wave device according to claim 15, wherein the plurality of walls are bonded to and support the cover.

* * * * *